(12) United States Patent
Jan et al.

(10) Patent No.: US 10,905,020 B2
(45) Date of Patent: Jan. 26, 2021

(54) ELECTRONIC DEVICE

(71) Applicants: Cheng-Shiue Jan, Taipei (TW); Wei-Hao Lan, Taipei (TW); Pai-Feng Chen, Taipei (TW); Han-Tsai Liu, Taipei (TW); Ying-Hua Chiang, Taipei (TW); Jyh-Chyang Tzou, Taipei (TW)

(72) Inventors: Cheng-Shiue Jan, Taipei (TW); Wei-Hao Lan, Taipei (TW); Pai-Feng Chen, Taipei (TW); Han-Tsai Liu, Taipei (TW); Ying-Hua Chiang, Taipei (TW); Jyh-Chyang Tzou, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 16/745,358

(22) Filed: Jan. 17, 2020

(65) Prior Publication Data
US 2020/0236801 A1    Jul. 23, 2020

Related U.S. Application Data

(60) Provisional application No. 62/793,899, filed on Jan. 18, 2019.

(51) Int. Cl.
*H05K 5/02* (2006.01)
*H05K 5/00* (2006.01)
(Continued)

(52) U.S. Cl.
CPC .............. *H05K 5/0226* (2013.01); *E05D 3/18* (2013.01); *F16C 11/04* (2013.01); *F16H 21/44* (2013.01);
(Continued)

(58) Field of Classification Search
CPC ...... H05K 5/0226; H05K 5/0017; E05D 3/18; F16H 21/44; F16C 11/04;
(Continued)

(56) References Cited

U.S. PATENT DOCUMENTS 9,348,450 B1 * 5/2016 Kim ...................... G06F 3/0412
9,470,404 B2 * 10/2016 Lee ........................ G09F 9/301
(Continued)

FOREIGN PATENT DOCUMENTS

TW        201716912        5/2017

*Primary Examiner* — Abhishek M Rathod
(74) *Attorney, Agent, or Firm* — JCIPRNET

(57) ABSTRACT

An electronic device includes a first body, a second body, a hinge mechanism, two driving mechanisms, at least two lifting mechanisms, and a flexible panel. The first body is connected to the second body through the hinge mechanism. The two driving mechanisms are disposed in the first and second bodies, respectively, and the hinge mechanism is connected to the two driving mechanisms. The lifting mechanisms are respectively disposed in the first body and the second body, and each lifting mechanism is connected to the corresponding driving mechanism. The hinge mechanism is configured to drive the two driving mechanisms which respectively drive the two lifting mechanisms to ascend or descend. The flexible panel includes a first bonding portion secured to the first body, a second bonding portion secured to the second body, and a bending portion between the first and second bonding portions. The bending portion contacts the two lifting mechanisms.

12 Claims, 11 Drawing Sheets

(51) Int. Cl.
   *E05D 3/18*   (2006.01)
   *F16H 21/44*   (2006.01)
   *F16C 11/04*   (2006.01)

(52) U.S. Cl.
   CPC ...... *H05K 5/0017* (2013.01); *E05Y 2900/606* (2013.01)

(58) Field of Classification Search
   CPC ..... E05Y 2900/606; G02F 2001/13332; G02F 1/133305; G02F 1/1333; G06F 1/16
   See application file for complete search history.

(56) References Cited

U.S. PATENT DOCUMENTS

| | | | | |
|---|---|---|---|---|
| 9,791,891 B2* | 10/2017 | Jung | | G06F 1/1652 |
| 9,826,626 B2* | 11/2017 | Myeong | | G06F 1/1681 |
| 9,844,251 B2* | 12/2017 | Lin | | G06F 1/1615 |
| 9,910,458 B2* | 3/2018 | Watanabe | | G02F 1/133305 |
| 10,551,880 B1* | 2/2020 | Ai | | G06F 1/1641 |
| 10,571,962 B2* | 2/2020 | Araki | | H04M 1/0268 |
| 10,694,623 B2* | 6/2020 | Park | | H05K 5/0017 |
| 10,754,395 B2* | 8/2020 | Sanchez | | H05K 5/0086 |
| 10,761,573 B2* | 9/2020 | Hsu | | G06F 1/1681 |
| 2015/0233162 A1* | 8/2015 | Lee | | G06F 1/1626 16/223 |
| 2015/0366089 A1* | 12/2015 | Park | | G06F 1/1652 361/679.01 |
| 2016/0085265 A1* | 3/2016 | Park | | G06F 1/1681 361/807 |
| 2016/0378203 A1* | 12/2016 | Kim | | G06F 1/1679 345/156 |
| 2018/0341295 A1* | 11/2018 | Lan | | G06F 1/1681 |
| 2019/0040904 A1* | 2/2019 | Hsu | | G06F 1/1681 |
| 2019/0179373 A1* | 6/2019 | Cheng | | H04M 1/0268 |
| 2019/0391618 A1* | 12/2019 | Hsu | | G06F 1/1681 |

* cited by examiner

ELECTRONIC DEVICE

CROSS REFERENCE TO RELATED APPLICATION

This application claims the priority benefit of U.S. provisional application Ser. No. 62/793,899, filed on Jan. 18, 2019. The entirety of the above-mentioned patent application is hereby incorporated by reference here and made a part of specification.

TECHNICAL FIELD

The disclosure relates to an electronic device, and more particularly, to an electronic device integrated with a flexible panel.

DESCRIPTION OF RELATED ART

With the development of display technology, the technology of flexible panels becomes more and more mature. In recent years, major electronics manufacturers have actively dedicated to the development and application of the flexible panels. For instance, the common flexible panels integrated into electronic devices such as displays, smart phones, tablet PCs, or notebook computers often have outward folding design and inward folding design. The so-called outward folding design refers to the design in which the display surface of the folded flexible panel faces the outside, and the so-called inward folding design refers to the design in which the display surface of the folded flexible panel faces the inside.

Generally, the flexible panel may be roughly divided into two bonding portions and a bending portion, where the two bonding portions are respectively fixed to two bodies of the electronic devices, and the bending portion is located between the two bonding portions. As far as the inward folding design is concerned, when the flexible panel is bent, the bending portion of the flexible panel is bent, and how to protect the bending portion from being squeezed and damaged by the two bodies of the electronic device during the bending operation has become an issue to be resolved.

SUMMARY

The disclosure provides an electronic device capable of reducing the risk of damage to a flexible panel.

An embodiment of the disclosure provides an electronic device that includes a first body, a second body, a hinge mechanism, two driving mechanisms, at least two lifting mechanisms, and a flexible panel. The first body is connected to the second body through the hinge mechanism. The hinge mechanism includes at least one first hinge member and at least one second hinge member that are pivotally connected to each other, and each of the first hinge member and the second hinge member includes a pivoting end and a sliding end. The pivoting end of the first hinge member is pivoted to the first body, and the sliding end is slidably disposed at the second body. The pivoting end of the second hinge member is pivoted to the second body, and the sliding end is slidably disposed at the first body. The two driving mechanisms are disposed in the first body and the second body, respectively. In the first body, the driving mechanism is connected to the sliding end of the second hinge member. In the second body, the driving mechanism is connected to the sliding end of the first hinge member. The two lifting mechanisms are disposed in the first body and the second body, respectively. In the first body, the sliding end of the second hinge member is configured to drive the driving mechanism, and the driving mechanism is configured to drive the lifting mechanism to ascend or descend. In the second body, the sliding end of the first hinge member is configured to drive the driving mechanism, and the driving mechanism is configured to drive the lifting mechanism to ascend or descend. The flexible panel includes a first bonding portion secured to the first body, a second bonding portion secured to the second body, and a bending portion located between the first bonding portion and the second bonding portion. The bending portion contacts the two lifting mechanisms.

In an embodiment of the disclosure, each of the driving mechanisms includes a driving member, a rotating member, and a driven member, and the driving member and the driven member are movably connected to two ends of the rotating member, respectively.

In an embodiment of the disclosure, in the first body, the driving member is connected to the sliding end of the second hinge member, the rotating member is pivoted to the first body, and the driven member is connected to the lifting mechanism.

In an embodiment of the disclosure, the hinge mechanism further includes a sliding pin disposed in the first body and a guiding stand fixed into the first body. The sliding end of the second hinge member and the driving member sleeve on the sliding pin, the sliding pin is inserted into a sliding groove of the guiding stand, and the pivoting end of the first hinge member is pivotally connected to the guiding stand.

In an embodiment of the disclosure, the driving member includes a first driving portion and a second driving portion pivotally connected to the first driving portion. The first driving portion is connected to the sliding end of the second hinge member, and the second driving portion is movably connected to the rotating member.

In an embodiment of the disclosure, in the second body, the driving member is connected to the sliding end of the first hinge member, the rotating member is pivoted to the second body, and the driven member is connected to the lifting mechanism.

In an embodiment of the disclosure, the hinge mechanism further includes a sliding pin disposed in the second body and a guiding stand fixed into the second body. The sliding end of the first hinge member and the driving member sleeve on the sliding pin, the sliding pin is inserted into a sliding groove of the guiding stand, and the pivoting end of the second hinge member is pivotally connected to the guiding stand.

In an embodiment of the disclosure, the driving member includes a first driving portion and a second driving portion pivotally connected to the first driving portion. The first driving portion is connected to the sliding end of the first hinge member, and the second driving portion is movably connected to the rotating member.

In an embodiment of the disclosure, each of the two lifting mechanisms includes a driving rod, a first driven rod connected to the driving rod, a support rod, and a second driven rod juxtaposed to the first driven rod, and the first driven rod and the second driven rod are pivotally connected to two ends of the support rod, respectively. The driven member of each of the two driving mechanisms is connected to the driving rod of the corresponding lifting mechanism.

In an embodiment of the disclosure, each of the two lifting mechanisms further includes a support plate fixed to the support rod, and the bending portion of the flexible panel contacts each of the support plates.

In an embodiment of the disclosure, each of the two lifting mechanisms further includes a base, and the first driven rod and the second driven rod are pivotally connected to two ends of the base, respectively.

In an embodiment of the disclosure, in the first body, the driving member is located between the hinge mechanism and the rotating member; in the second body, the driving member is located between hinge mechanism and the rotating member.

Based on the above, the electronic device provided in one or more embodiments of the disclosure includes the first body and the second body, and the first body is connected to the second body through the hinge mechanism. Further, the driving mechanisms and the lifting mechanisms are disposed inside the first body and the second body, wherein the driving mechanisms are connected to the hinge mechanism, and the lifting mechanisms are connected to the driving mechanisms. When the first body and the second body rotate relative to each other through the hinge mechanism, the hinge mechanism drives the driving mechanisms, and the driving mechanisms drive the lifting mechanisms, so that the bending portion of the flexible panel ascends or descends together with the lifting mechanisms. During the transition of the electronic device from the unfolded state to the folded state, the lifting mechanisms descend, and the bending portion of the flexible panel is bent and moved into the first body and the second body, so as to protect the bending portion of the flexible panel from being squeezed and damaged by the first body and the second body.

In order to make the above features and advantages of the disclosure more comprehensible, embodiments are hereinafter described in detail with reference to the accompanying drawings.

DESCRIPTION OF THE EMBODIMENTS

Figure 1A:
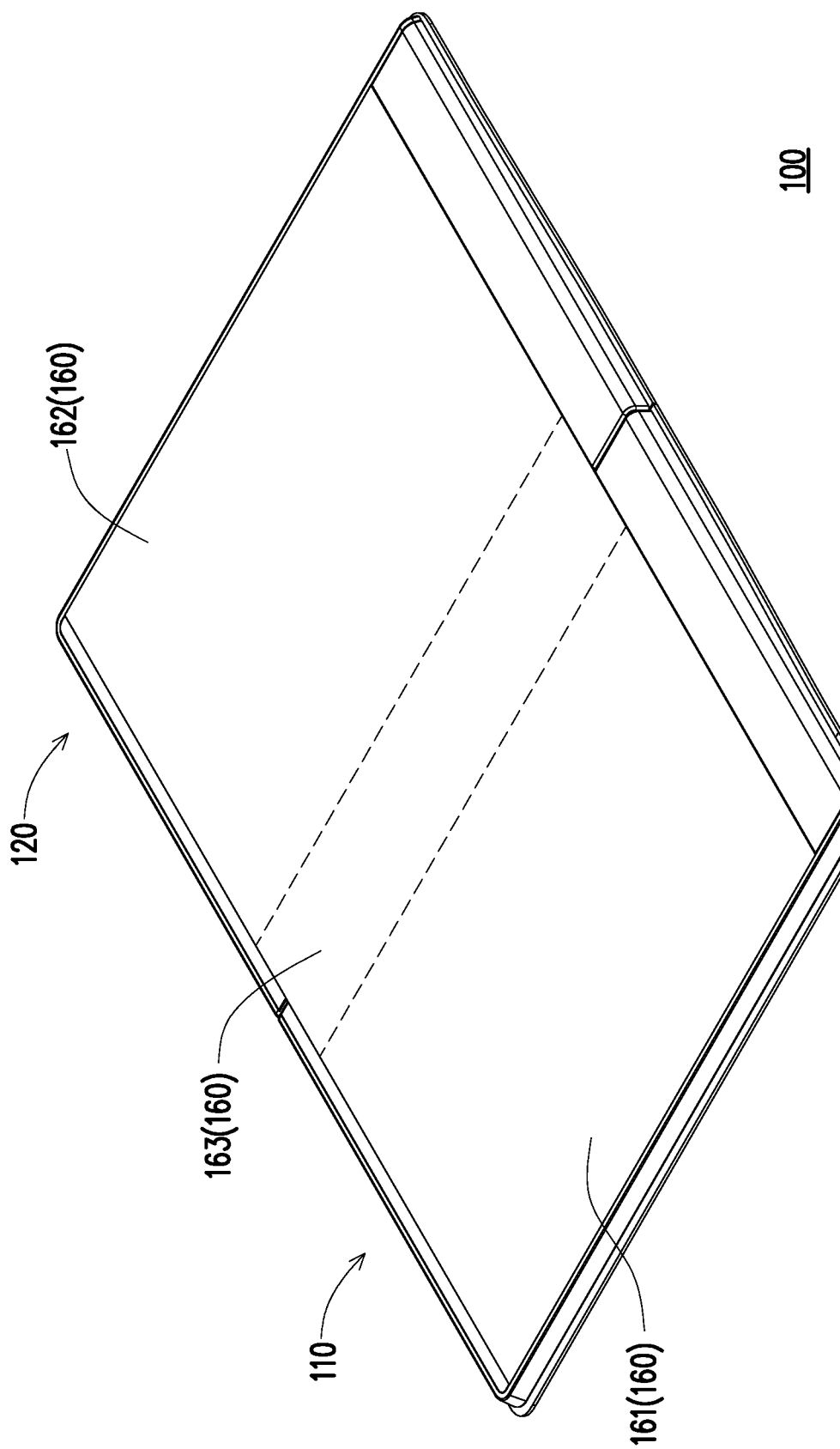
FIG. 1A is a schematic diagram illustrating an electronic device in an unfolded state according to an embodiment of the disclosure.
Figure 1B:
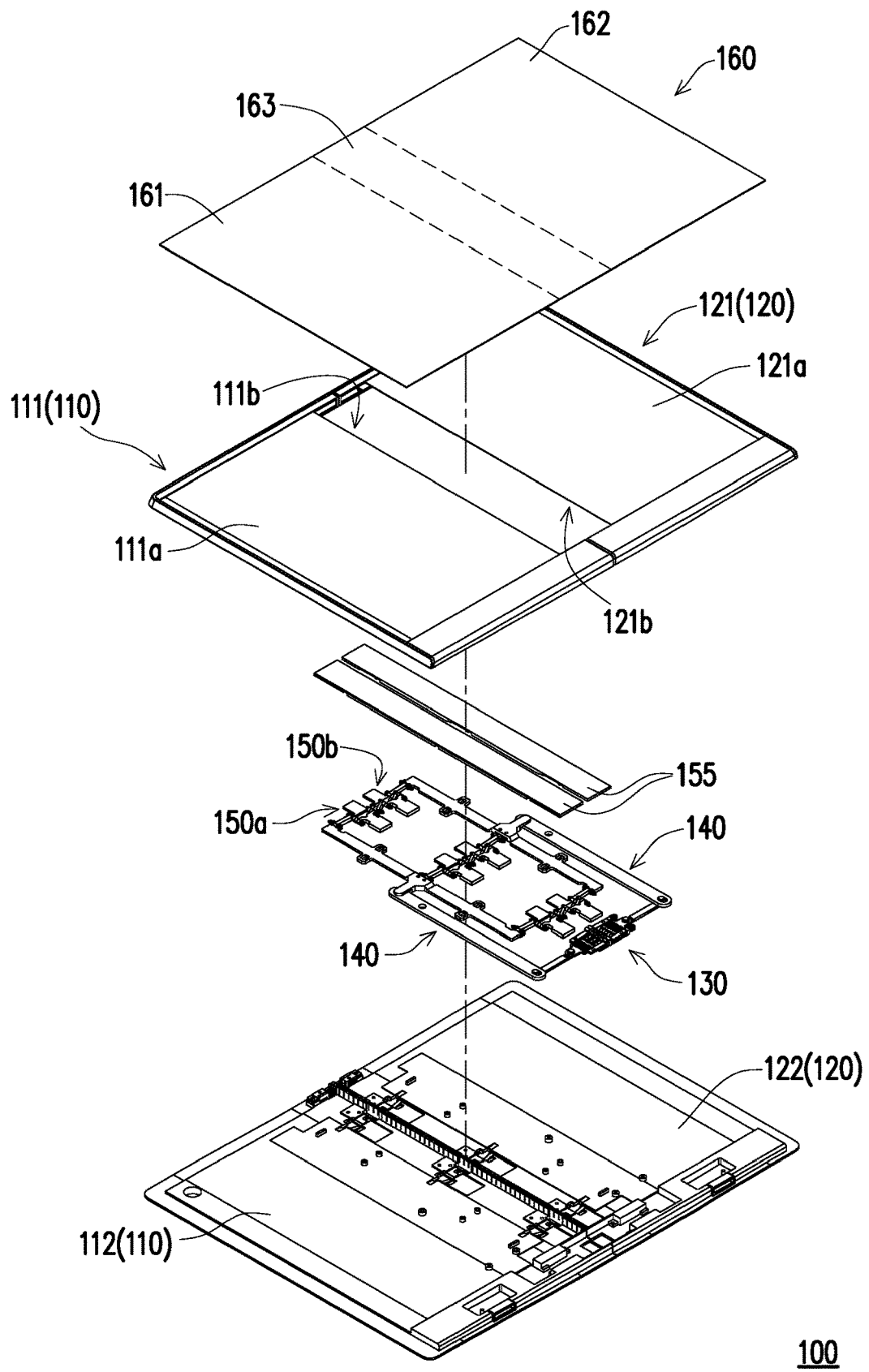
FIG. 1B is a schematic explosive diagram illustrating the electronic device in FIG. 1A.
Figure 1C:
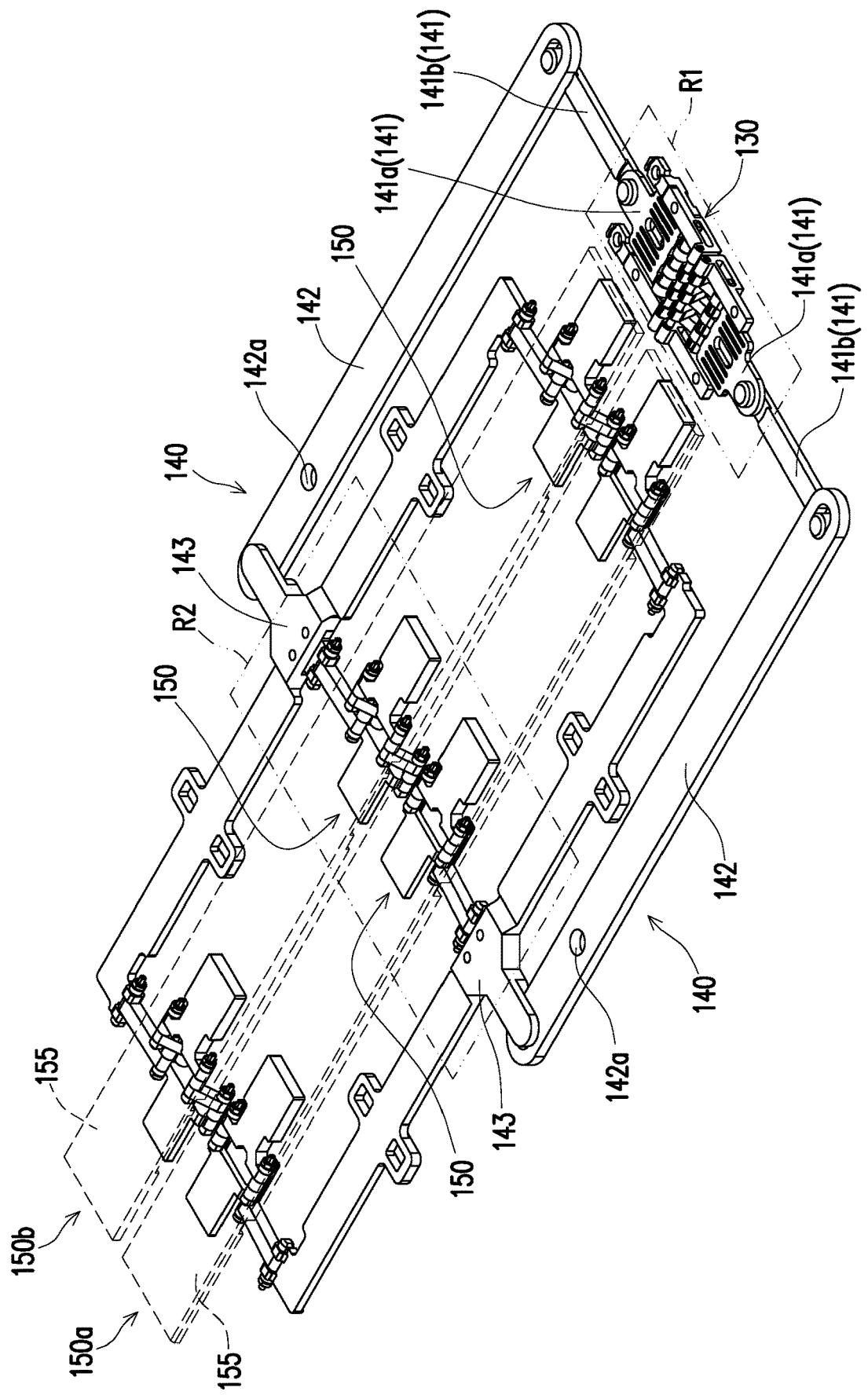
FIG. 1C is a schematic diagram illustrating the hinge mechanism, the driving mechanisms, and the lifting mechanisms in FIG. 1B.

FIG. 1A is a schematic diagram illustrating an electronic device in an unfolded state according to an embodiment of the disclosure. FIG. 1B is a schematic explosive diagram illustrating the electronic device in FIG. 1A. FIG. 1C is a schematic diagram illustrating the hinge mechanism, the driving mechanisms, and the lifting mechanisms in FIG. 1B. Particularly, as shown in FIG. 1C, support plates 155 are drawn by dashed lines to clearly show the other components of the lifting mechanisms 150.

First, please refer to FIG. 1A to FIG. 1C. In this embodiment, the electronic device 100 is in an unfolded state, and the electronic device 100 may be a display, a tablet PC, a smart phone, or a part of a notebook computer. In detail, the electronic device 100 includes a first body 110, a second body 120, a hinge mechanism 130, two driving mechanisms 140, at least two lifting mechanisms 150, and a flexible panel 160. The first body 110 is connected to the second body 120 through the hinge mechanism 130, and the hinge mechanism 130 is configured to provide relative rotational degree of freedom of the first body 110 and the second body 120, so that the electronic device 100 may be switched between an unfolded state and a folded state. For instance, the hinge mechanism 130 has a torque design, so that the first body 110 and the second body 120 may stay in a specific operating state to prevent the first body 110 and the second body 120 from falling suddenly or rotating arbitrarily.

Figure 2A:
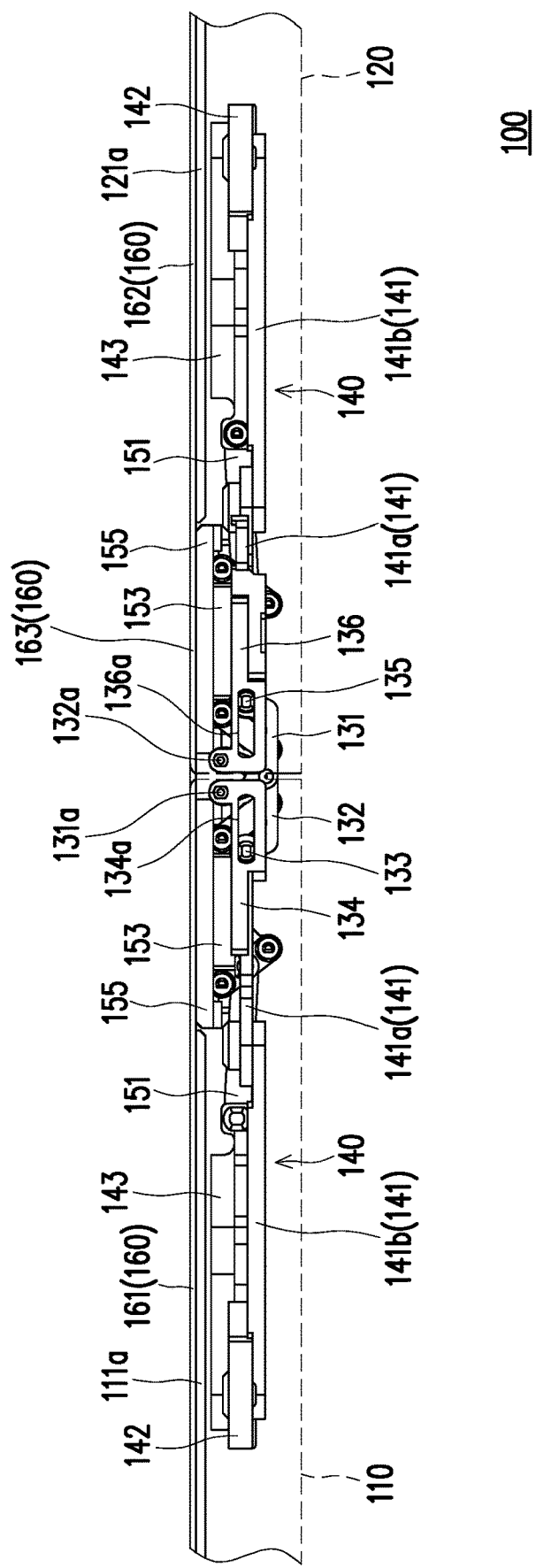
FIG. 2A is a schematic enlarged side view of a portion of the electronic device in FIG. 1A.
Figure 2B:
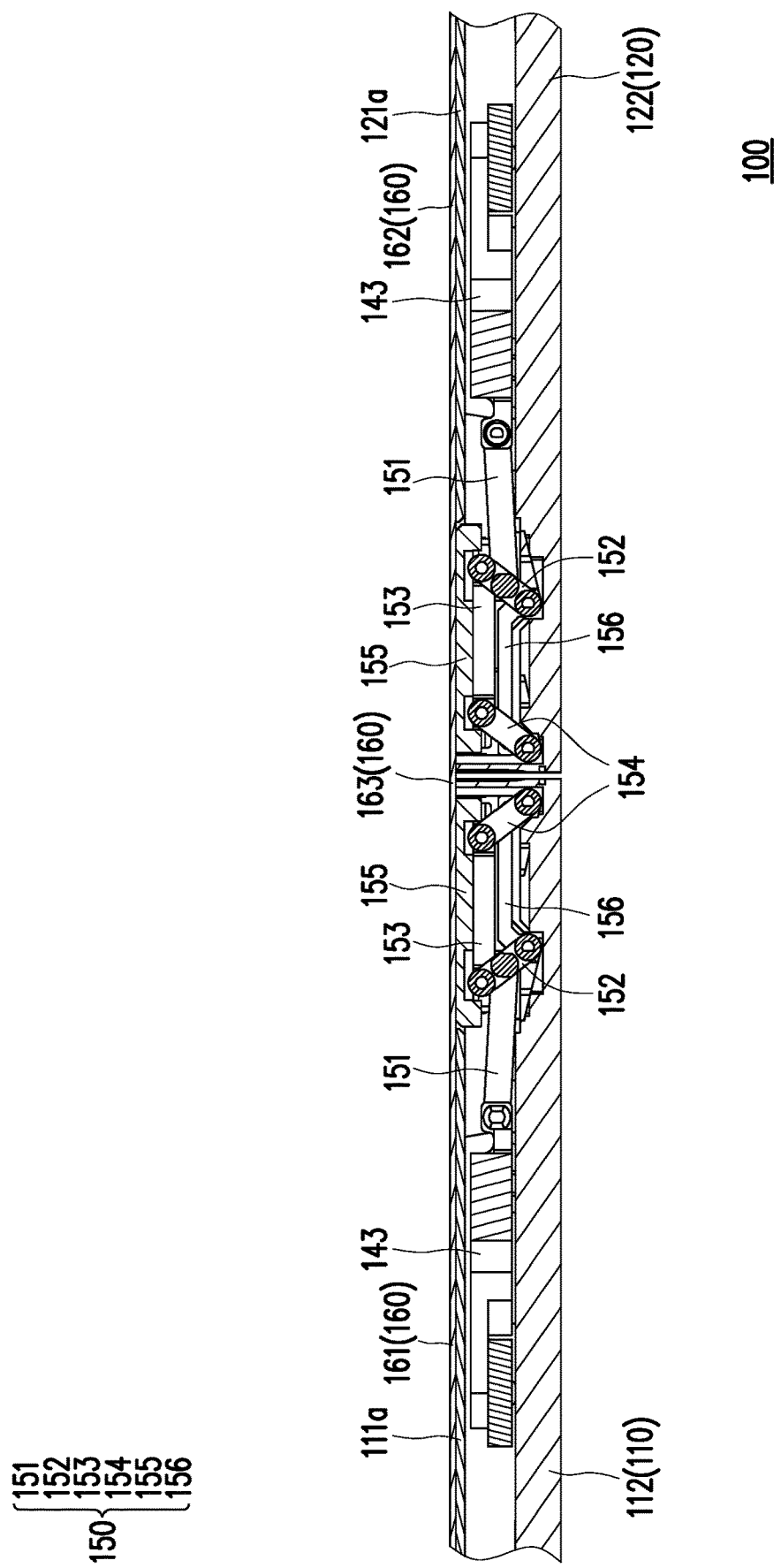
FIG. 2B is a schematic enlarged cross-sectional view of a portion of the electronic device in FIG. 1A.

FIG. 2A is a schematic enlarged side view of a portion of the electronic device in FIG. 1A. FIG. 2B is a schematic enlarged cross-sectional view of a portion of the electronic device in FIG. 1A. In particular, in FIG. 2A, the first body 110 and the second body 120 are drawn by dashed lines to clearly show the internal structural configuration.

Please refer to FIG. 1B, FIG. 1C, FIG. 2A, and FIG. 2B. In this embodiment, the first body 110 may include a first upper casing 111 and a first lower casing 112, and the second body 120 may include a second upper casing 121 and a second lower casing 122. The first upper casing 111 and the second upper casing 121 are juxtaposed, the first upper casing 111 includes a first installation portion 111a and a first recess portion 111b adjacent to the first installation portion 111a, and the second upper casing 121 includes a second installation portion 121a and a second recess portion 121b adjacent to the second installation portion 121a. The first recess portion 111b faces the second recess portion 121b, and the first installation portion 111a and the second installation portion 121a are located between two sides of the first recess portion 111b and the second recess portion 121b. For instance, the first recess portion 111b and the second recess portion 121b may be recesses or gaps on the casings.

In detail, the flexible panel 160 includes a first bonding portion 161, a second bonding portion 162, and a bending portion 163 located between the first bonding portion 161 and the second bonding portion 162, the first bonding portion 161 is secured to the first installation portion 111a, and the second bonding portion 162 is secured to the second installation portion 121a. On the other hand, the bending portion 163 is aligned to or overlapped with the first recess portion 111b and the second recess portion 121b, and the first recess portion 111b and the second recess portion 121b are configured to move the bending portion 163 into or out of the first body 110 and the second body 120.

One portion of the hinge mechanism 130 is disposed on the first lower casing 112 and located between the first upper casing 111 and the first lower casing 112. Another portion of the hinge mechanism 130 is disposed on the second lower casing 122 and located between the second upper casing 121 and the second lower casing 122. Further, the hinge mechanism 130 bridges the first lower casing 112 and the second lower casing 122, and the one portion of the hinge mechanism 130 disposed on the first lower casing 112 is symmetrical to the another portion of the hinge mechanism 130 disposed on the second lower casing 122.

One of the two driving mechanisms 140 is disposed on the first lower casing 112 and located between the first upper casing 111 and the first lower casing 112. In other words, one of the two driving mechanisms 140 is disposed in the first body 110. The other driving mechanism 140 is disposed on the second lower casing 122 and located between the second upper casing 121 and the second lower casing 122. In other words, the other of the two driving mechanisms 140 is disposed in the second body 120. Furthermore, the driving mechanism 140 disposed on the first lower casing 112 is connected to the one portion of the hinge mechanism 130 disposed on the first lower casing 112, and the driving mechanism 140 disposed on the second lower casing 122 is connected to the another portion of the hinge mechanism 130 disposed on the second lower casing 122.

In this embodiment, the number of the lifting mechanisms 150 is six, and three are categorized as one group. Accordingly, the lifting mechanisms 150 may be roughly divided into a first lifting assembly 150a and a second lifting assembly 150b. The first lifting assembly 150a is disposed on the first lower casing 112 and located between the first upper casing 111 and the first lower casing 112. In other words, the first lifting assembly 150a is disposed in the first body 110. The second lifting assembly 150b is disposed on the second lower casing 122 and located between the second upper casing 121 and the second lower casing 122. In other words, the second lifting assembly 150b is disposed in the second body 120. Further, the first lifting assembly 150a and the second lifting assembly 150b are symmetrically configured, the first lifting assembly 150a is aligned to the first recess portion 111b, and the second lifting assembly 150b is aligned to the second recess portion 121b, so as to contact and support the bending portion 163.

In other embodiments, the number of the lifting mechanisms in each lifting assembly may be increased or decreased according to design requirements.

In this embodiment, the first lifting assembly 150a is connected to the driving mechanism 140 disposed on the first lower casing 112, and the second lifting assembly 150b is connected to the driving mechanism 140 disposed on the second lower casing 122. When the hinge mechanism 130 is actuated, the driving mechanism 140 disposed on the first lower casing 112 and the driving mechanism 140 disposed on the second lower casing 122 are synchronously driven by the hinge mechanism 130. At this time, the driving mechanism 140 disposed on the first lower casing 112 drives the first lifting assembly 150a to ascend or descend, and the driving mechanism 140 disposed on the second lower casing 122 drives the second lifting assembly 150b to ascend or descend, so that the bending portion 163 in contact with the first lifting assembly 150a and the second lifting assembly 150b correspondingly ascends or descends accordingly.

Figure 3A:
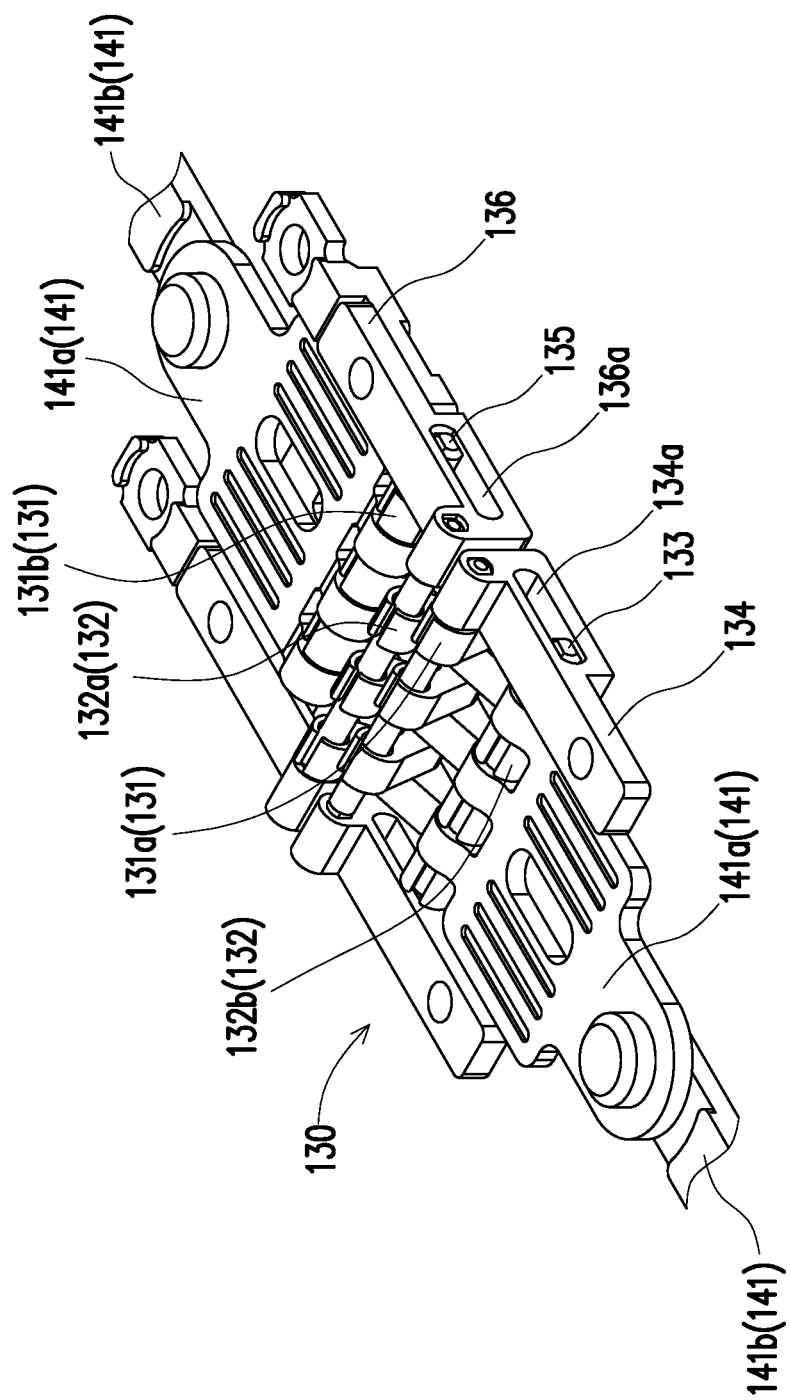
FIG. 3A is a schematic enlarged view of the region R1 in FIG. 1C.
Figure 3B:
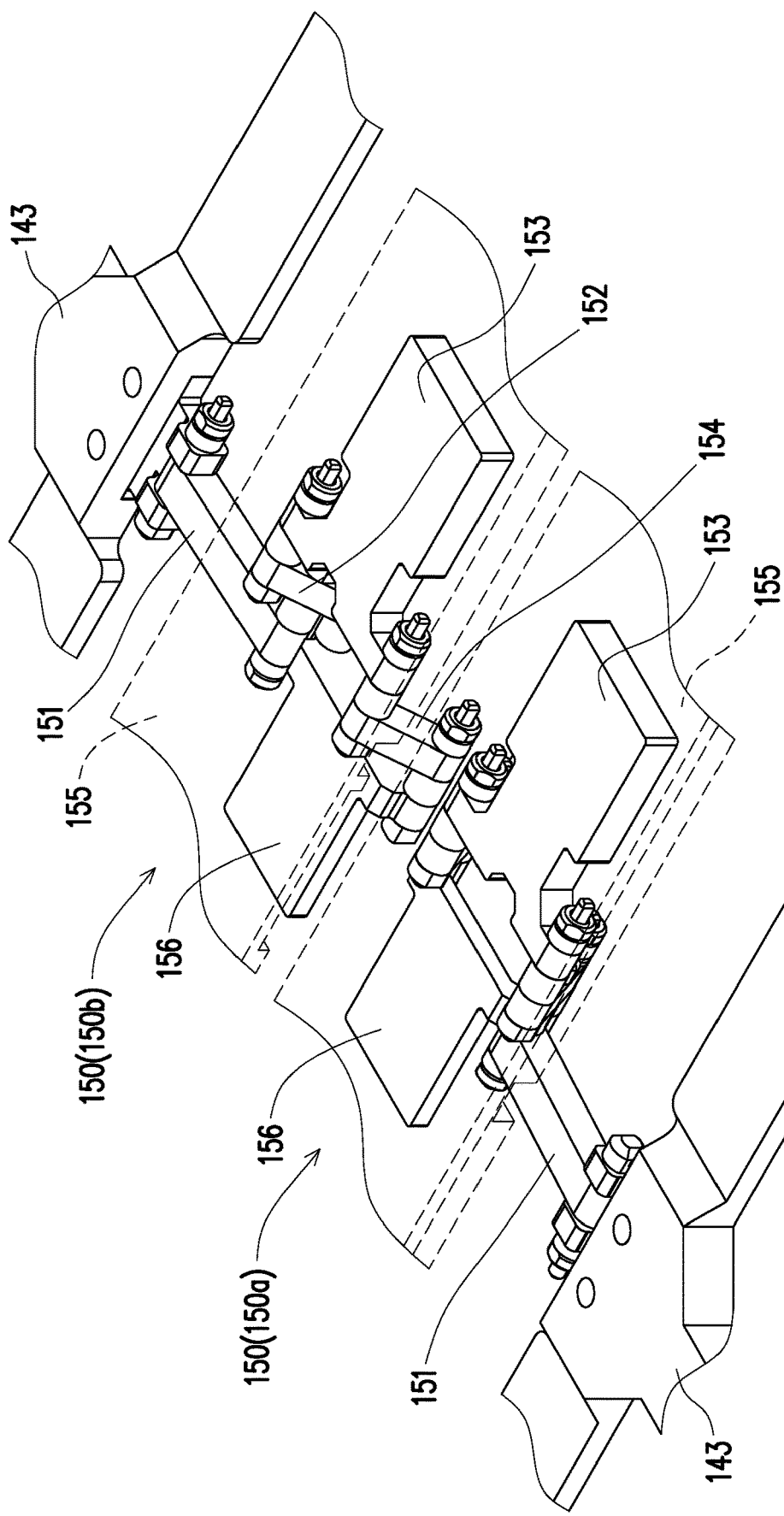
FIG. 3B is a schematic enlarged view of the region R2 in FIG. 1C.

FIG. 3A is a schematic enlarged view of the region R1 in FIG. 1C. FIG. 3B is a schematic enlarged view of the region R2 in FIG. 1C. Please refer to FIG. 1B, FIG. 1C, FIG. 2A, and FIG. 3A. In this embodiment, the hinge mechanism 130 includes at least one first hinge member 131 and at least one second hinge member 132 pivotally connected to each other, and the number of the first hinge member 131 and the number of the second hinge member 132 may be plural. The first hinge member 131 and the second hinge member 132 are alternately arranged. On the other hand, the pivotal rotation axis of the adjacent first and second hinge members 131 and 132 are between the first body 110 and the second body 120 as the reference axis when the first body 110 and the second body 120 are relatively rotated, so as to improve stability of the first body 110 and the second body 120 during the relative rotation.

In detail, the first hinge member 131 includes a pivoting end 131a and a sliding end 131b, wherein the pivoting end 131a is pivoted to the first body 110, and the sliding end 131b is slidably disposed at the second body 120. On the other hand, the second hinge member 132 includes a pivoting end 132a and a sliding end 132b. The pivoting end 132a of the second hinge member 132 is pivoted to the second body 120, and the sliding end 132b is slidably disposed on the first body 110. In the first body 110, the driving mechanism 140 is connected to the sliding end 132b of the second hinge member 132. In the second body 120, the driving mechanism 140 is connected to the sliding end 131b of the first hinge member 131. When the first hinge member 131 and the second hinge member 132 rotate relatively, the sliding end 131b of the first hinge member 131 drives the driving mechanism 140 disposed on the second lower casing 122, and the sliding end 132b of the second hinge member 132 drives the driving mechanism 140 disposed on the first lower casing 112.

In this embodiment, each of the driving mechanisms 140 includes a driving member 141, a rotating member 142, and a driven member 143. The driving member 141 may be rotatably and slidably connected to one end of the rotating member 142, and the driven member 143 may be rotatably and slidably connected to the other end of the rotating member 142, so as to ensure that the actuation of the driving mechanism 140 is smooth.

In the first body 110, the driving member 141 is connected to the sliding end 132b of the second hinge member 132, the rotating member 142 is pivoted to the first lower casing 112 of the first body 110, and the driven member 143 is connected to the first lifting assembly 150a. The rotating member 142 is configured to rotate around a rotation pivot point 142a relative to the first lower casing 112, and a distance between the rotation pivot point 142a and the driven member 143 is smaller than a distance between the rotation pivot point 142a and the driving member 141. The distance between the rotation pivot point 142a and the driving member 141 may be deemed as an arm of force. In the case of a large arm of force, the driving member 141 is more likely to drive the rotating member 142, so that the rotating member 142 drives the driven member 143, and the driven member 143 drives the first lifting assembly 150a.

In the second body 120, the driving member 141 is connected to the sliding end 131b of the first hinge member 131, the rotating member 142 is pivoted to the second lower casing 122 of the second body 120, and the driven member 143 is connected to the second lifting assembly 150b. The rotating member 142 is configured to rotate around the rotation pivot point 142a relative to the second lower casing 122, and the distance between the rotation pivot point 142a and the driven member 143 is smaller than the distance between the rotation pivot point 142a and the driving member 141. The distance between the rotation pivot point 142a and the driving member 141 may be deemed as the arm of force. In the case of a large arm of force, the driving member 141 is more likely to drive the rotating member 142, so that the rotating member 142 drives the driven member 143, and the driven member 143 drives the second lifting assembly 150b.

For instance, each driving member 141 includes a first driving portion 141a and a second driving portion 141b pivotally connected to the first driving portion 141a. In the first body 110, the first driving portion 141a of the driving member 141 is connected to the sliding end 132b of the second hinge member 132, and the second driving portion 141b is rotatably and slidably connected to the rotating member 142. Therefore, the first driving portion 141a may slide back and forth in a specific direction together with the sliding end 132b of the second hinge member 132, and the second driving portion 141b may slide together with the first driving portion 141a and rotate relative to the first driving portion 141a, so as to ensure that the actuation of the driving mechanism 140 is smooth.

In the second body 120, the first driving portion 141a of the driving member 141 is connected to the sliding end 131b of the first hinge member 131, and the second driving portion 141b is rotatably and slidably connected to the rotating member 142. Therefore, the first driving portion 141a may slide back and forth in a specific direction together with the sliding end 131b of the first hinge member 131, and the second driving portion 141b may slide together with the first driving portion 141a and rotate relative to the first driving portion 141a, so as to ensure that the actuation of the driving mechanism 140 is smooth.

Please refer to FIG. 2A and FIG. 3A. In this embodiment, the hinge mechanism 130 further includes a first sliding pin 133 disposed in the first body 110, a first guiding stand 134 fixed into the first body 110, a second sliding pin 135 disposed in the second body 120, and a second guiding stand 136 fixed into second body 120. The first sliding pin 133 and the second sliding pin 135 are symmetrically configured, and the first guiding stand 134 and the second guiding stand 136 are symmetrically configured. In the first body 110, the sliding end 132b of the second hinge member 132 and the driving member 141 sleeve on the first sliding pin 133, and the first sliding pin 133 is configured to connect the second hinge member 132 and the driving member 141. In the second body 120, the sliding end 131b of the first hinge member 131 and the driving member 141 sleeve on the second sliding pin 135, and the second sliding pin 135 is configured to connect the first hinge member 131 and the driving member 141.

Further, the first sliding pin 133 is inserted into a sliding groove 134a of the first guiding stand 134, and the pivoting end 131a of the first hinge member 131 is pivotally connected to the first guiding stand 134. The second sliding pin 135 is inserted into a sliding groove 136a of the second guiding stand 136, and the pivoting end 132a of the second hinge member 132 is pivotally connected to the second guiding stand 136. On the other hand, the pivoting end 131a of the first hinge member 131 and the pivoting end 132a of the second hinge member 132 are located between the sliding groove 134a of the first guiding stand 134 and the sliding groove 136a of the second guiding stand 136.

When the pivoting end 131a of the first hinge member 131 rotates relative to the first guiding stand 134, the sliding end 131b of the first hinge member 131 drives the second sliding pin 135 and the driving member 141 to slide relative to the second guiding stand 136. When the pivoting end 132a of the second hinge member 132 rotates relative to the second guiding stand 136, the sliding end 132b of the second hinge member 132 drives the first sliding pin 133 and the driving member 141 to slide relative to the first guiding stand 134.

Please refer to FIG. 1C, FIG. 2A, FIG. 2B, and FIG. 3B. According to this embodiment, in the first body 110, the driving member 141 is located between the hinge mechanism 130 and the rotating member 142; in the second body 120, the driving member 141 is located between the hinge mechanism 130 and the rotating member 142. On the other hand, each lifting mechanism 150 includes a driving rod 151, a first driven rod 152 connected to the driving rod 151, a support rod 153, and a second driven rod 154 juxtaposed to the first driven rod 152. The driving rod 151 has the rotational degree of freedom relative to the first driven rod 152.

The first driven rod 152 and the second driven rod 154 are pivotally connected to two ends of the support rod 153, respectively, and the first driven rod 152 and the second driven rod 154 are parallel to each other, so that the support rod 153 at the time of actuation remains horizontal. In either the first body 110 or the second body 120, the driven member 143 of the driving mechanism 140 is connected to the driving rod 151 of the lifting mechanism 150, and the driven member 143 has the rotational degree of freedom relative to the driving rod 151.

Further, each lifting mechanism 150 further includes the support plate 155 fixed to the support rod 153, and the bending portion 163 of the flexible panel 160 contacts each support plate 155. Furthermore, in any lifting assembly, the number of the support plate 155 is one, and the support rods 153 of the lifting mechanisms 150 are connected to the support plates 155. In the first body 110, the first driven rod 152 and the second driven rod 154 are pivotally connected to the first lower casing 112, and a pivot point where the driving rod 151 is pivotally connected to the first driven rod 152 is located between the support rod 153 and the first lower casing 112. In the second body 120, the first driven rod 152 and the second driven rod 154 are pivotally connected to the second lower casing 122, and a pivot point where the driving rod 151 is pivotally connected to the first driven rod 152 is located between the support rod 153 and the second lower casing 122.

In the first body 110 (or the second body 120), when the driven member 143 of the driving mechanism 140 drives the driving rod 151 of the corresponding lifting mechanism 150, the driving rod 151 drives the first driven rod 152 to rotate relative to the first lower casing 112 (or the second lower casing 122), and drives the second driven rod 154 to rotate relative to the first lower casing 112 (or the second lower casing 122) through the support rod 153. At this time, the first driven rod 152 and the second driven rod 154 are synchronously rotated toward or away from the first lower casing 112 (or the second lower casing 122), so that the support rod 153 and the support plate 155 on the support rod 153 descend or ascend.

On the other hand, each lifting mechanism 150 further includes a base 156. In the first body 110, the base 156 is fixed to the first lower casing 112, and the first driven rod 152 and the second driven rod 154 are pivotally connected to two ends of the base 156, respectively. In the second body 120, the base 156 is fixed to the second lower casing 122, and the first driven rod 152 and the second driven rod 154 are pivotally connected to the two ends of the base 156, respectively.

Figure 4A:
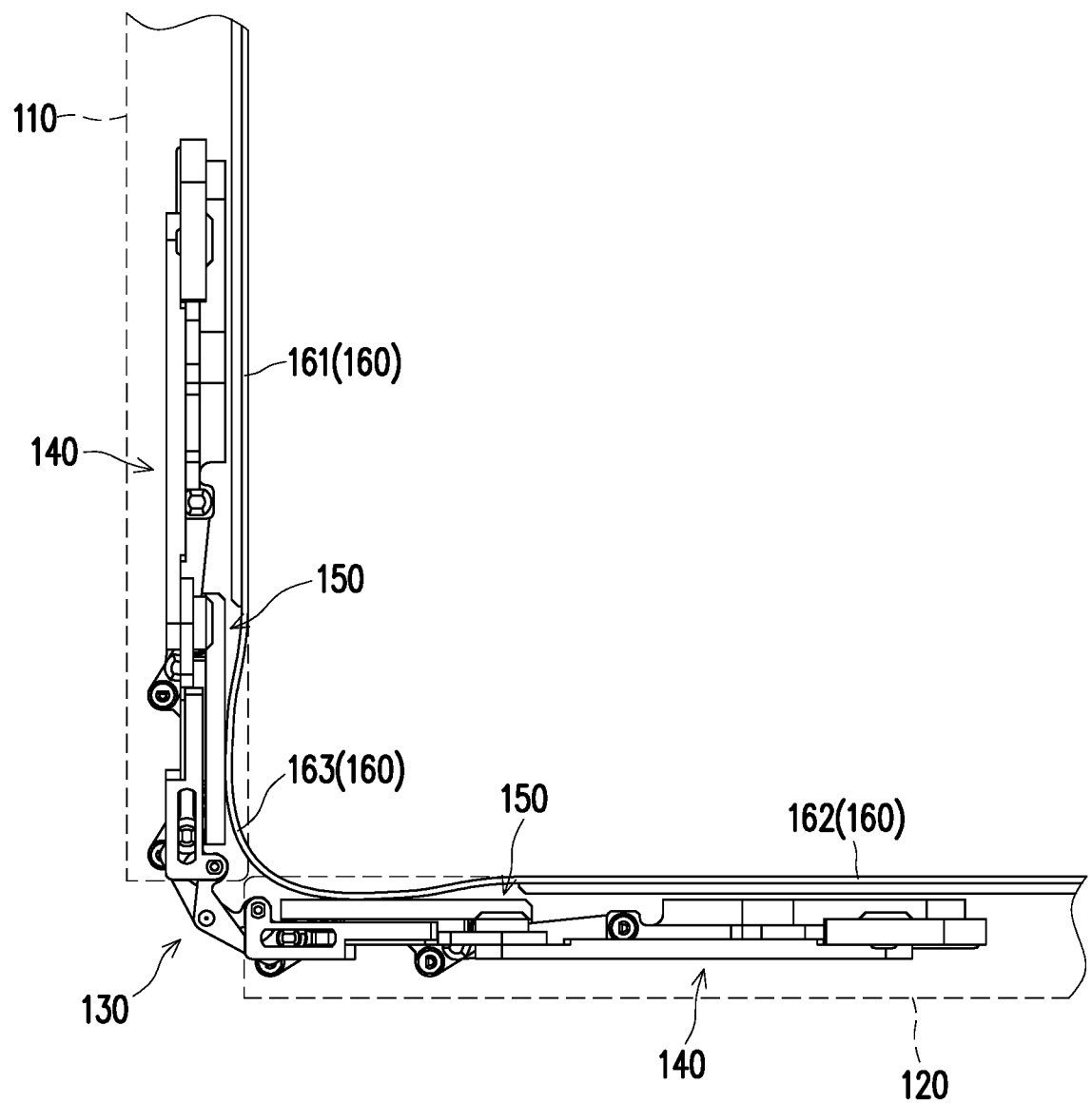
FIG. 4A is a schematic enlarged side view of a portion of the electronic device in FIG. 2A after it is switched to a transitional state.
Figure 4B:
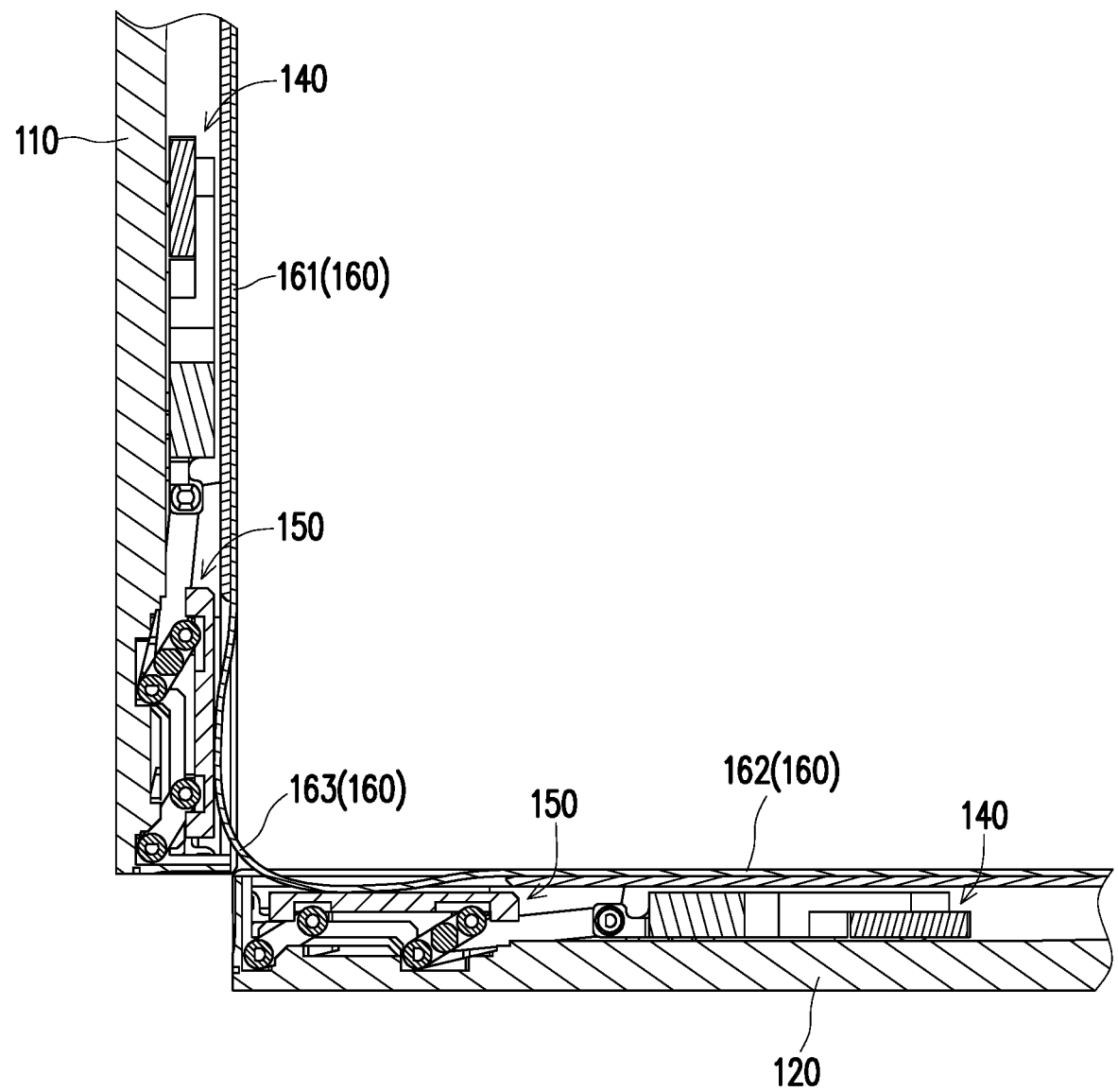
FIG. 4B is a schematic enlarged cross-sectional view of a portion of the electronic device in FIG. 2B after it is switched to the transitional state.

FIG. 4A is a schematic enlarged side view of a portion of the electronic device in FIG. 2A after it is switched to a transitional state. FIG. 4B is a schematic enlarged cross-sectional view of a portion of the electronic device in FIG. 2B after it is switched to the transitional state. Particularly, in FIG. 4A, the first body 110 and the second body 120 are drawn by dashed lines to clearly show the internal structural configuration. Please refer to FIG. 2A and FIG. 2B. When the electronic device 100 is in an unfolded state, the flexible panel 160 is unfolded, the bending portion 163 is supported by the lifting mechanisms 150, and the first bonding portion 161, the second bonding portion 162, and the bending portion 163 are coplanar. Next, please refer to FIG. 4A and FIG. 4B. When the electronic device 100 is changed to the transitional state, the first body 110 rotates relative to the second body 120 through the hinge mechanism 130, and an included angle between the first body 110 and the second body 120 is, for instance, 90 degrees.

During the transition of the electronic device 100 from the unfolded state to the transitional state, the hinge mechanism 130 is actuated and drives two driving mechanisms 140, and the two driving mechanisms 140 drive the lifting mechanisms 150 to descend. The bending portion 163 descends together with the lifting mechanisms 150 and is bent relative to the first bonding portion 161 and the second bonding portion 162 and moved into the first body 110 and the second body 120.

Figure 5A:
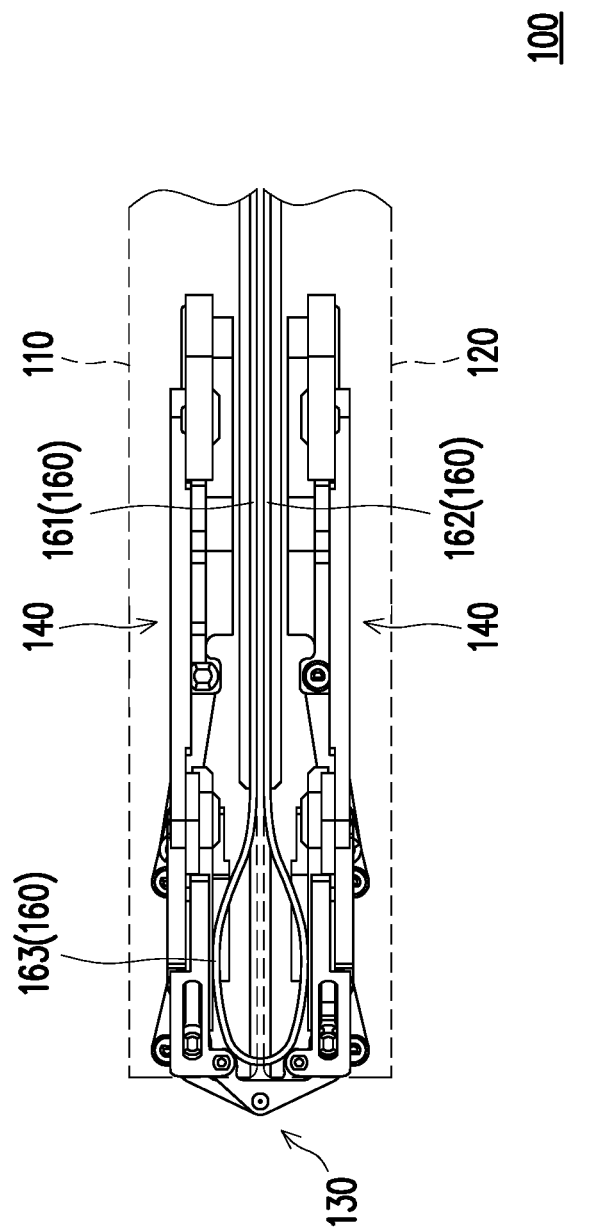
FIG. 5A is a schematic enlarged side view of a portion of the electronic device in FIG. 4A after it is switched to a folded state.
Figure 5B:
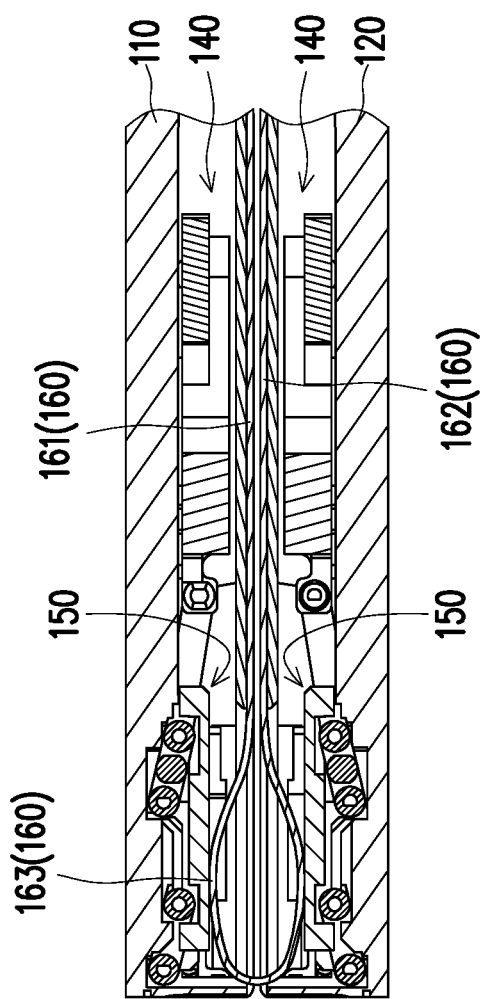
FIG. 5B is a schematic enlarged cross-sectional view of a portion of the electronic device in FIG. 4B after it is switched to the folded state.

FIG. 5A is a schematic enlarged side view of a portion of the electronic device in FIG. 4A after it is switched to a folded state. FIG. 5B is a schematic enlarged cross-sectional view of a portion of the electronic device in FIG. 4B after it is switched to the folded state. Particularly, in FIG. 5A, the first body 110 and the second body 120 are drawn by dashed lines to clearly show the internal structural configuration. As shown in FIG. 5A and FIG. 5B, when the electronic device 100 is switched to the folded state, the first body 110 rotates relative to the second body 120 through the hinge mechanism 130, and the included angle between the first body 110 and the second body 120 is, for instance, 0 degree.

During the transition of the electronic device 100 from the transitional state to the folded state, the hinge mechanism 130 is actuated and drives two driving mechanisms 140, and the two driving mechanisms 140 drive the lifting mechanisms 150 to further descend. The bending portion 163 further descends together with the lifting mechanisms 150 and is further bent relative to the first bonding portion 161 and the second bonding portion 162 and moved into the first body 110 and the second body 120, so that the bending portion 163 is protected from being squeezed and damaged by the first body 110 and the second body 120.

To sum up, the electronic device provided in one or more embodiments of the disclosure includes the first body and the second body, and the first body is connected to the second body through the hinge mechanism. Further, the driving mechanisms and the lifting mechanisms are disposed inside the first body and the second body, wherein the driving mechanisms are connected to the hinge mechanism, and the lifting mechanisms are connected to the driving mechanisms. When the first body and the second body rotate relative to each other through the hinge mechanism, the hinge mechanism drives the driving mechanisms, and the driving mechanisms drive the lifting mechanisms, so that the bending portion of the flexible panel ascends or descends together with the lifting mechanisms. During the transition of the electronic device from the unfolded state to the folded state, the lifting mechanisms descend, and the bending portion of the flexible panel is bent and moved into the first body and the second body, so as to protect the bending portion of the flexible panel from being squeezed and damaged by the first body and the second body.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device, comprising:
a first body;
a second body
a hinge mechanism, the first body being connected to the second body through the hinge mechanism, wherein the hinge mechanism comprises at least one first hinge member and at least one second hinge member that are pivotally connected to each other, the at least one first hinge member and the at least one second hinge member comprise a pivoting end and a sliding end, the pivoting end of the at least one first hinge member is pivoted to the first body, the sliding end of the at least one first hinge member is slidably disposed at the second body, the pivoting end of the at least one second hinge member is pivoted to the second body, and the sliding end of the at least one second hinge member is slidably disposed at the first body;
two driving mechanisms respectively disposed in the first body and the second body, wherein the driving mechanism in the first body is connected to the sliding end of the at least one second hinge member, and the driving mechanism in the second body is connected to the sliding end of the at least one first hinge member;
at least two lifting mechanisms respectively disposed in the first body and the second body,
in the first body, the driving mechanism being connected to the lifting mechanism, the sliding end of the at least one second hinge member being configured to drive the driving mechanism, the driving mechanism driving the lifting mechanism to ascend or descend,
in the second body, the driving mechanism is connected to the lifting mechanism, the sliding end of the at least one first hinge member being configured to drive the driving mechanism, the driving mechanism driving the lifting mechanism to ascend or descend; and
a flexible panel comprising a first bonding portion secured to the first body, a second bonding portion secured to the second body, and a bending portion located between the first bonding portion and the second bonding portion, the bending portion contacting the at least two lifting mechanisms.

2. The electronic device according to claim 1, wherein each of the two driving mechanisms comprises a driving member, a rotating member, and a driven member, and the driving member and the driven member are movably connected to two ends of the rotating member, respectively.

3. The electronic device according to claim 2, wherein in the first body, the driving member is connected to the sliding end of the at least one second hinge member, the rotating member is pivoted to the first body, and the driven member is connected to the lifting mechanism.

4. The electronic device according to claim 3, wherein the hinge mechanism further comprises a sliding pin disposed in the first body and a guiding stand fixed into the first body, the sliding end of the at least one second hinge member and the driving member sleeve on the sliding pin, the sliding pin is inserted into a sliding groove of the guiding stand, and the pivoting end of the at least one first hinge member is pivotally connected to the guiding stand.

5. The electronic device according to claim 3, wherein the driving member comprises a first driving portion and a second driving portion pivotally connected to the first driving portion, the first driving portion is connected to the sliding end of the at least one second hinge member, and the second driving portion is movably connected to the rotating member.

6. The electronic device according to claim 2, wherein in the second body, the driving member is connected to the sliding end of the at least one first hinge member, the rotating member is pivoted to the second body, and the driven member is connected to the lifting mechanism.

7. The electronic device according to claim 6, wherein the hinge mechanism further comprises a sliding pin disposed in the second body and a guiding stand fixed into the second body, the sliding end of the at least one first hinge member and the driving member sleeve on the sliding pin, the sliding pin is inserted into a sliding groove of the guiding stand, and the pivoting end of the at least one second hinge member is pivotally connected to the guiding stand.

8. The electronic device according to claim 6, wherein the driving member comprises a first driving portion and a second driving portion pivotally connected to the first driving portion, the first driving portion is connected to the sliding end of the at least one first hinge member, and the second driving portion is movably connected to the rotating member.

9. The electronic device according to claim 2, wherein each of the at least two lifting mechanisms comprises a driving rod, a first driven rod connected to the driving rod, a support rod, and a second driven rod juxtaposed to the first driven rod, the first driven rod and the second driven rod are pivotally connected to two ends of the support rod, respectively, and the driven member of each of the two driving mechanisms is connected to the driving rod of the corresponding lifting mechanism.

10. The electronic device according to claim 9, wherein each of the at least two lifting mechanisms further comprises a support plate fixed to the support rod, and the bending portion of the flexible panel contacts each of the support plates.

11. The electronic device according to claim 9, wherein each of the at least two lifting mechanisms further comprises a base, and the first driven rod and the second driven rod are pivotally connected to two ends of the base, respectively.

12. The electronic device according to claim 2, wherein in the first body, the driving member is located between the hinge mechanism and the rotating member, and in the second body, the driving member is located between the hinge mechanism and the rotating member.

* * * * *